US007944951B2

(12) United States Patent
Hardcastle

(10) Patent No.: US 7,944,951 B2
(45) Date of Patent: May 17, 2011

(54) BROADBRAND SWITCHED MULTIPLEXER

(75) Inventor: Peter William Hardcastle, Bradford (GB)

(73) Assignee: Teledyne Defence Ltd., West Yorkshire (GB)

( * ) Notice: Subject to any disclaimer, the term of this patent is extended or adjusted under 35 U.S.C. 154(b) by 26 days.

(21) Appl. No.: 12/304,036

(22) PCT Filed: Jun. 7, 2007

(86) PCT No.: PCT/GB2007/002092
§ 371 (c)(1),
(2), (4) Date: Dec. 9, 2008

(87) PCT Pub. No.: WO2007/141528
PCT Pub. Date: Dec. 13, 2007

(65) Prior Publication Data

US 2010/0166000 A1 Jul. 1, 2010

(30) Foreign Application Priority Data

Jun. 9, 2006 (GB) .................................. 0611445.8

(51) Int. Cl.
*H04J 3/04* (2006.01)

(52) U.S. Cl. ........................................ 370/535; 370/532

(58) Field of Classification Search .................. 370/532, 370/533, 535, 536, 537
See application file for complete search history.

(56) References Cited

U.S. PATENT DOCUMENTS

| | | | | |
|---|---|---|---|---|
| 4,736,171 | A | 4/1988 | Minarik | |
| 5,796,307 | A * | 8/1998 | Kumagai et al. | 330/149 |
| 5,838,675 | A | 11/1998 | Rauscher | |
| 5,909,294 | A * | 6/1999 | Doerr et al. | 398/138 |

OTHER PUBLICATIONS

Christen Rauscher "A Channelized-Limiter Approach to Receiver Front-End Protection" IEEE Transactions on Microwave Theory and Techniques, IEEE Service Center Piscataway, NJ, US, vol. 44, No. 7, Jul. 1996 XP011036492 ISSN: 0018-9480.

* cited by examiner

*Primary Examiner* — Huy D Vu
*Assistant Examiner* — Dady Chery
(74) *Attorney, Agent, or Firm* — Quinn Law Group, PLLC

(57) ABSTRACT

A broadband switched multiplexer comprising an input broadband demultiplexer (2) comprising a broadband input port (4) for receiving an input broadband signal and at least one output port (5) having a passband; an output broadband multiplexer (3) comprising at least two input ports (6) and a broadband output port (7), each input port having a different passband, each input port passband overlapping a different portion of the demultiplexer output port passband; the demultiplexer output port being in electrical communication with the multiplexer input ports by signal paths (8), each signal path having a switch (13) for opening and closing the path therein.

25 Claims, 16 Drawing Sheets

BROADBRAND SWITCHED MULTIPLEXER

The present invention relates to a broadband switched multiplexer. More particularly, but not exclusively the present invention relates to a broadband switched multiplexer having interdigitated input and output passbands, at least some of the input passbands being sufficiently broad to overlap the output passbands on either side.

INTRODUCTION

Electronic Warfare systems operate over multi-octave frequency spectrums. In today's modern battlespace, the microwave spectrum is becoming increasingly dense as a result of increased sources of microwave transmitters both on-platform (cosite issues), and within the littoral environment. This can causes significant problems for the broadband system to successfully detect threats, particularly in the case of high probability of intercept (HPI) systems. Many solutions have been developed to minimise these problems, ranging from simple switched filters, tuneable band-pass/band-stop filters to limiters, including the frequency selective form. However, all solutions generally limit the overall operational effectiveness of the system in one way or another.

The switched multiplexer according to the invention seeks to overcome these problems. It is particularly suitable for use in signal thinning applications in dense signal environments not achievable by known systems.

Accordingly, the present invention provides a broadband switched multiplexer comprising an input broadband demultiplexer comprising a broadband input port for receiving an input broadband signal and at least one output port having a passband;

an output broadband multiplexer comprising at least two input ports and a broadband output port, each input port having a different passband, each input port passband overlapping a different portion of the demultiplexer output port passband;

the demultiplexer output port being in electrical communication with the multiplexer input ports by signal paths, each signal path having a switch for opening and closing the path therein.

Preferably, the input broadband demultiplexer has a plurality of output ports each having a different passband;

the output broadband multiplexer has a plurality of input ports each having a different passband;

and, the passbands is arranged such that each of the input port passbands at least partially overlaps an output port passband, at least some of the input port passbands overlapping two output port passbands.

Preferably, the centres of the input port passbands and the output port passbands are interdigitated, at least some of the input port passbands being sufficiently broad as to overlap the output port passbands on either side.

Preferably, at least some of the output port passbands are sufficiently broad as to overlap the input port passbands on either side Preferably, the input and output port passbands overlap so as to form a chain of alternating overlapping input and output port passbands.

The centres of at least one of the input port passbands and output port passbands can be equally spaced.

The demultiplexer can have n output ports, the input and output port passbands being arranged such that there are either 2n or 2(n−2)+2 through channels of overlapping input and output port passbands.

The switches in the signal paths can be non reflective.

At least one signal path can comprise a signal limiter.

Preferably, at least one of the multiplexer or demultiplexer is a Hi/Lo cascade broadband multiplexer/demultiplexer.

At least one signal line can include an attenuator.

Preferably, the broadband switched multiplexer further comprises at least one power divider positioned within a signal path for splitting a received signal from the corresponding output port into at least two portions, at least one of the portions being received by an input port having a passband which overlaps that of the output port.

Preferably, the broadband switched multiplexer comprises a plurality of power dividers, each power divider being adapted to split a signals from an associated output port into at least two portions, at least one portion of each signal being received by at least one input port.

Preferably, the broadband switched multiplexer further comprises frequency measurement means, the frequency measurement means, the frequency measurement means being adapted to receive signal portions from a plurality of power dividers.

The broadband switched multiplexer can further comprise switching means between the power dividers and the frequency measurement means, the switching means being adapted to connect the frequency measurement means to different power dividers.

Preferably, at least one power divider splits the signal from an output port into two portions, the two portions being received by two input ports, the input ports having passbands which overlap that of the output port connected to the power divider.

Preferably, the broadband switched multiplexer comprises at least one power combiner for combining signals from at least two output ports and providing the combined signal to an input port, the passband of the input port overlapping the passbands of the output ports.

The at least one power combiner can be adapted to combine split signals from two different power dividers and provide the combined signal to an input port.

A plurality of signal paths from associated output ports can comprise amplitude measurement means, preferably DLVAs.

The amplitude measurement means can be narrowband amplitude measurement means relative to the broadband demultiplexer.

Each amplitude measurement means can be adapted to open or close its associated signal path between output and input ports depending upon the signal measured by the amplitude measurement means.

Preferably, the broadband switched multiplexer further comprises frequency measurement means connected to the output broadband port of the output broadband multiplexer.

The frequency measurement means can be a narrowband frequency measurement means relative to the broadband multiplexer.

The broadband switched multiplexer can further comprise a frequency down converter between broadband multiplexer and frequency measurement means, the frequency down converter adapted to shift the frequency of the signal received from the broadband output port of the multiplexer by a factor dependent upon which signal path between input demultiplexer and output multiplexer is open.

The broadband switched multiplexer can comprise a superheterodyne receiver connected to the output broadband port of the output broadband multiplexer.

Preferably, the broadband switched multiplexer comprises at least one further output broadband multiplexer, the output broadband multiplexer having a plurality of input ports and a broadband output port at least some of the power dividers having an output connected to an input port of the further output broadband multiplexer.

The output broadband port of one output broadband multiplexer can connected to a frequency measurement means and the output broadband port of the additional broadband multiplexer can be connected to a superheterodyne receiver.

The present invention will now be described by way of example only, and not in any limitative sense, with reference to the accompanying drawings in which FIG. 1 shows in schematic form the multiplexer according to the invention;

Previous papers have described a methodology to achieve narrow band true switched multiplexer performance using unique bandpass prototypes with optimised phase characteristics to enable overall signal recombination. Multiplexing is generally realised using non-contiguous odd and even banks to simplify alignment. The inability of these structures to hold characteristics over wide bandwidths results in the need to consider a lowpass/highpass filtering approach.

Figure 1:
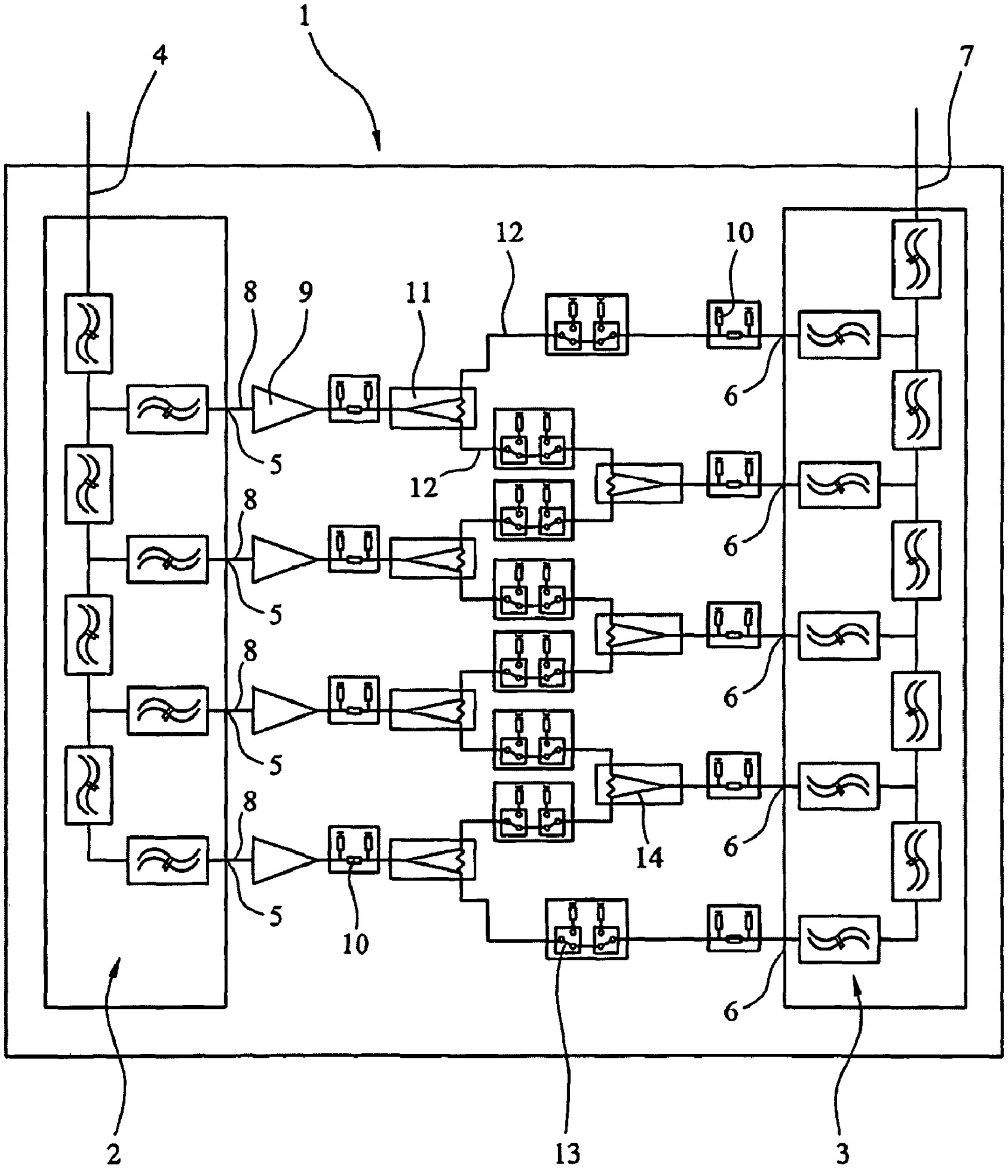

Shown in FIG. 1 in schematic form is a broadband switched multiplexer 1 according to the invention comprising an input broadband lowband/highband cascade demultiplexer 2 and an output broadband lowband/highband multiplexer 3. The input broadband demultiplexer 2 has an input broadband port 4 for receiving an input broadband signal and a plurality of output ports 5. Each output port 5 has a different output passband function as a function of frequency. Similarly, the multiplexer 3 comprises a plurality of input ports 6 each having a different passband and an output broadband port 7.

Extending from each output port is a signal path 8. In each signal path 8 is an amplifier 9 to capture the noise figure (NF) early in the structure. Next in the line is an attenuator 10 for adjusting the magnitude of the signal. After the attenuator 10 a power divider 11 splits the signal into two separate paths 12. Non reflective switches 13 in the separate paths 12 connect/disconnect these separate signal paths 12 to the second half of the switched multiplexer as shown. The second half of the switched multiplexer is symmetric to the first (apart from the amplifiers 9). Power combiner (power dividers connected in reverse) 14 in the second half of the circuit combine separate signals into signal paths to the input ports 6 of the multiplexer 3.

Figure 2:
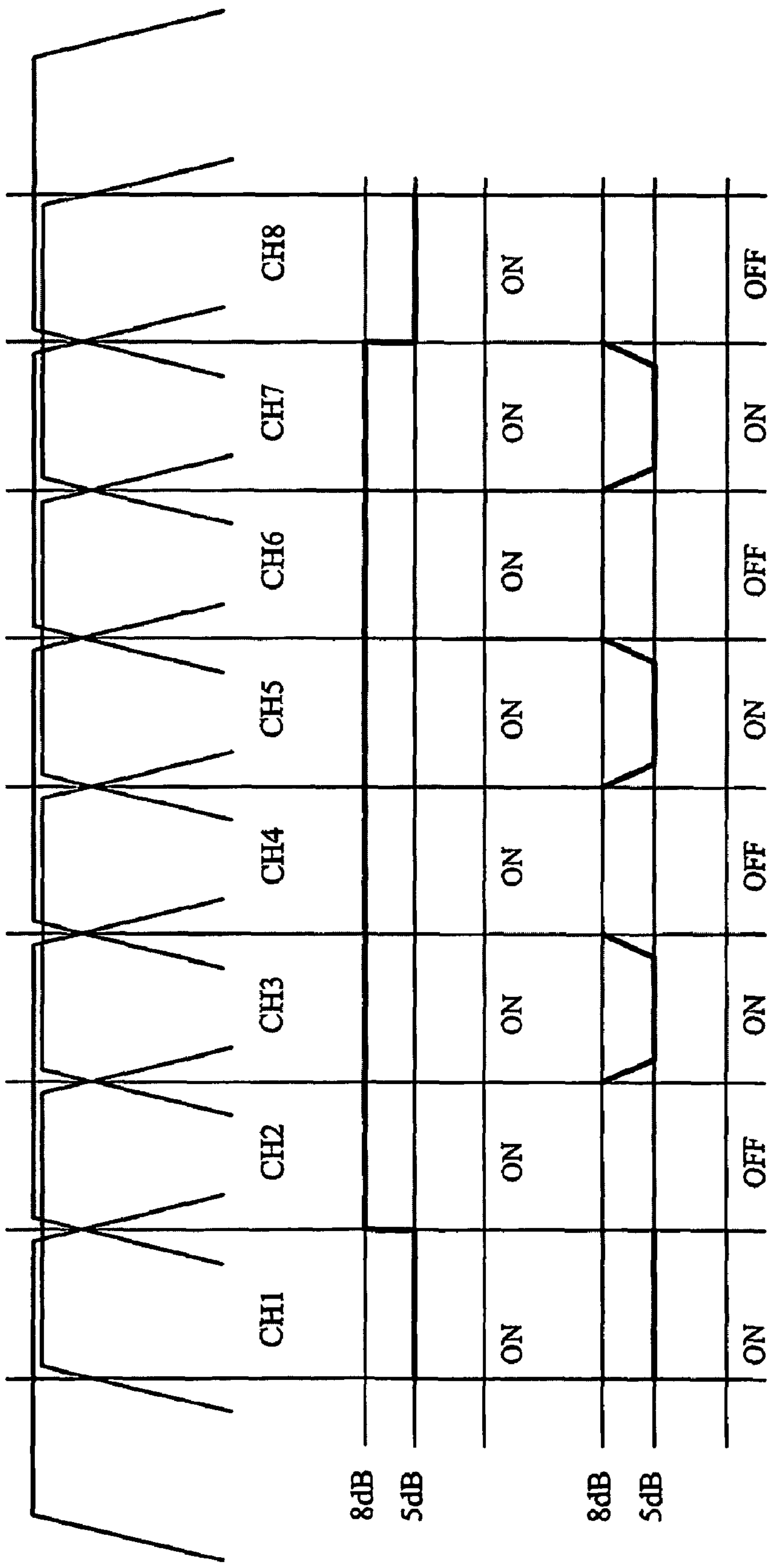
FIG. 2 shows in schematic form the passbands of the input and output ports.

The operation of the switched multiplexer 1 according to the invention is shown in schematic form in FIG. 2. The top line of the figure shows the passbands of the input and output ports 5,6. The centres of the passbands of the input and output ports 5,6 are interdigitated and equally spaced. The passbands are sufficiently broad that the input and output passbands overlap as shown.

When all the switches 13 are closed the switched multiplexer 1 has a broad passband made up of a plurality of through channels where the input and output passbands overlap. By opening one or more of the switches 13 one can remove one or more of the through channels so altering the passband of the switched multiplexer 1. In this embodiment the through channels are formed by the combined half bands of the input and output ports 5,6 of the multiplexer/demultiplexer 2,3 as shown. Other arrangements are also possible.

Recombination.

The use of high selectivity LP/HP filters in the broadband multiplexer/demultiplexer 2,3 inherently results in the crossover region exhibiting a rapid rate of change of phase with frequency. If we consider the standard chebychev prototype;

$$Fcheb = \sinh\left(\frac{1}{\text{Degree}} \cdot \operatorname{asinh}\left(\sqrt{\frac{1}{\frac{Lr}{10^{10}-1}}}\right)\right) \tag{1}$$

$$Fresponse(\omega) = c \cdot \frac{\text{Degree}}{\prod_{m=1}^{2}\left[\begin{array}{c} -\omega^2 + \left[2 \cdot Fcheb\left(\cos\left(\pi \cdot \frac{2 \cdot m - 1}{2 \cdot \text{Degree}}\right)\right)\right] \cdot j\omega + \\ Fcheb^2 + \left[\sin\left[\frac{\pi}{2 \cdot \text{Degree}} \cdot (2 \cdot m - 1)\right]\right]^2 \end{array}\right]} \tag{2}$$

Crossover loss must be 6 dB (due to the power dividers dissipating half power when in band) and each path in-phase to recombine. Eq 3 describes the crossover recombination;

$$S21(\omega) = Fresponse\left(\frac{\omega}{\omega lp}\right) \cdot \lambda(\theta) + Fresponse\left(\frac{-\omega hp}{\omega}\right) \tag{3}$$

$$Fresponse\left(\frac{\omega_{x\_over}}{\omega lp}\right) = Fresponse\left(\frac{-\omega hp}{\omega_{x_{over}}}\right) - 0.5 \tag{4}$$

Where $\lambda(\theta)$ is a unity vector of arbitrary phase. It can be shown that this architecture is relatively tolerant to phase errors, with minor distortions to the prototype and crossover loss, phase errors of some magnitude can be accommodated, and exceptional recombination achieved.

Noise Figure and Group-Delay

In this system, signals are subject to parallel paths; at mid-band there are two combining noise sources, and a single signal path, of which the splitter absorbs half of its power. At crossover, there are also two noise sources, but two combining signal paths of equal, but quarter power (with reference to in-band signal), hence NF remains relatively consistent across the band (see FIG. 2$b$, FIG. 2$c$). The NF is therefore approximated by;

$$MuxINF + \frac{2 \cdot ampNF - 1}{Mux1\text{loss}} + \frac{1 + 2 \cdot (Mux2NF - 1)}{Mux1\text{loss} \cdot ampGain} \quad \text{Mid-band (5)}$$

-continued $$2\cdot\left(Mux1NF+\frac{ampNF-1}{Mux1\text{loss}}+\frac{Mux2NF-1}{Mux1\text{loss}\cdot ampGain}\right)\quad\text{Crossover (6)}$$

Mux1NF, Mux1loss are mid-band both cases.

GD is also subject to parallel paths at recombination, maximum GD can therefore be estimated by simply calculating the differential of phase at the 6 dB crossover point.

Amplitude Equalisation

As with most broadband systems, passive loss, and component transfer functions require a degree of amplitude equalization. Due to the level of channelisation, one can apply fixed attenuators 10 for coarse equalisation across the full band. It is advantageous to add these attenuators 10 to the common port of all the power dividers 11. Although this results in each attenuator 10 covering two bands simultaneously, almost any equalizer response is possible. It is also advantageous to bias attenuation towards the output multiplexer 3 as this is inherently reflective within its adjacent band, which can increase recombined ripple if not sufficiently matched.

Design

Multiplexers

Figure 3:
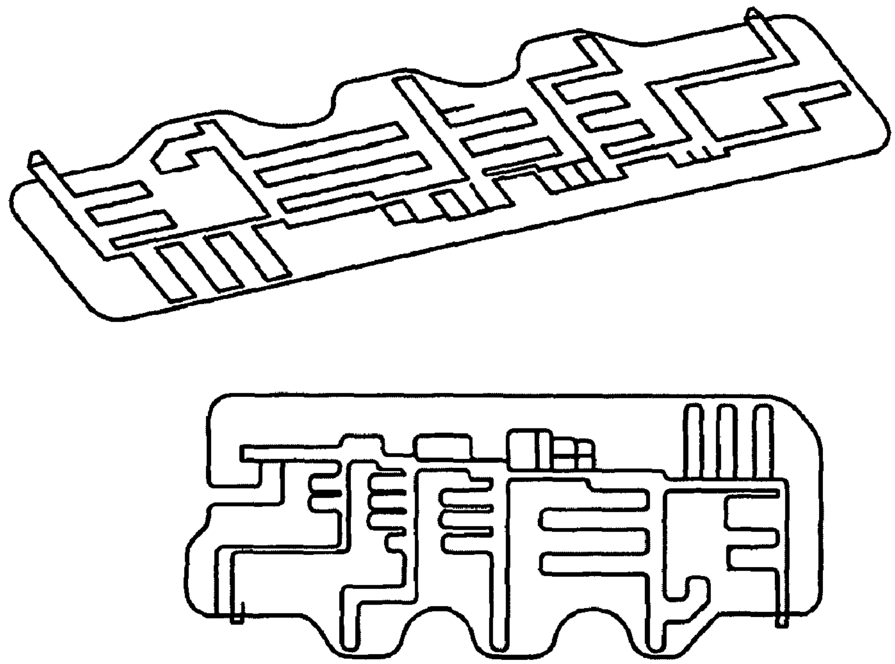
FIG. 3 shows the design of the multiplexer or demultiplexer of the switched multiplexer according to the invention.

The LP/HP filter designs of the multiplexers/demultiplexers 2, 3 of the switched multiplexer 1 according to the invention are based on the generalized form of the chebychev prototype, slightly modified for improved cascaded return loss performance. These are directly synthesised as suspended substrate stripline (SSS) networks, using Filtronic proprietary software. Analysis, and initial layout, was performed using AWR Microwave with a dedicated proprietary model library for the SSS structures, as shown in FIG. 3.

Power Dividers.

Figure 4:
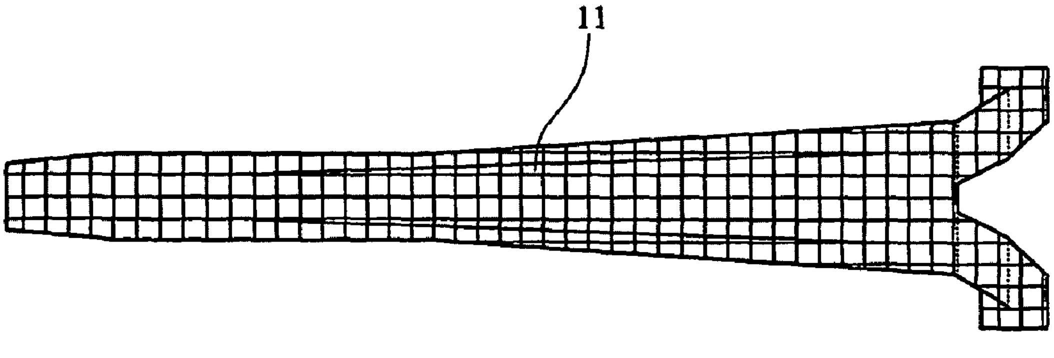
FIG. 4 shows a power divider used in the switched multiplexer according to the invention.
Figure 5A:
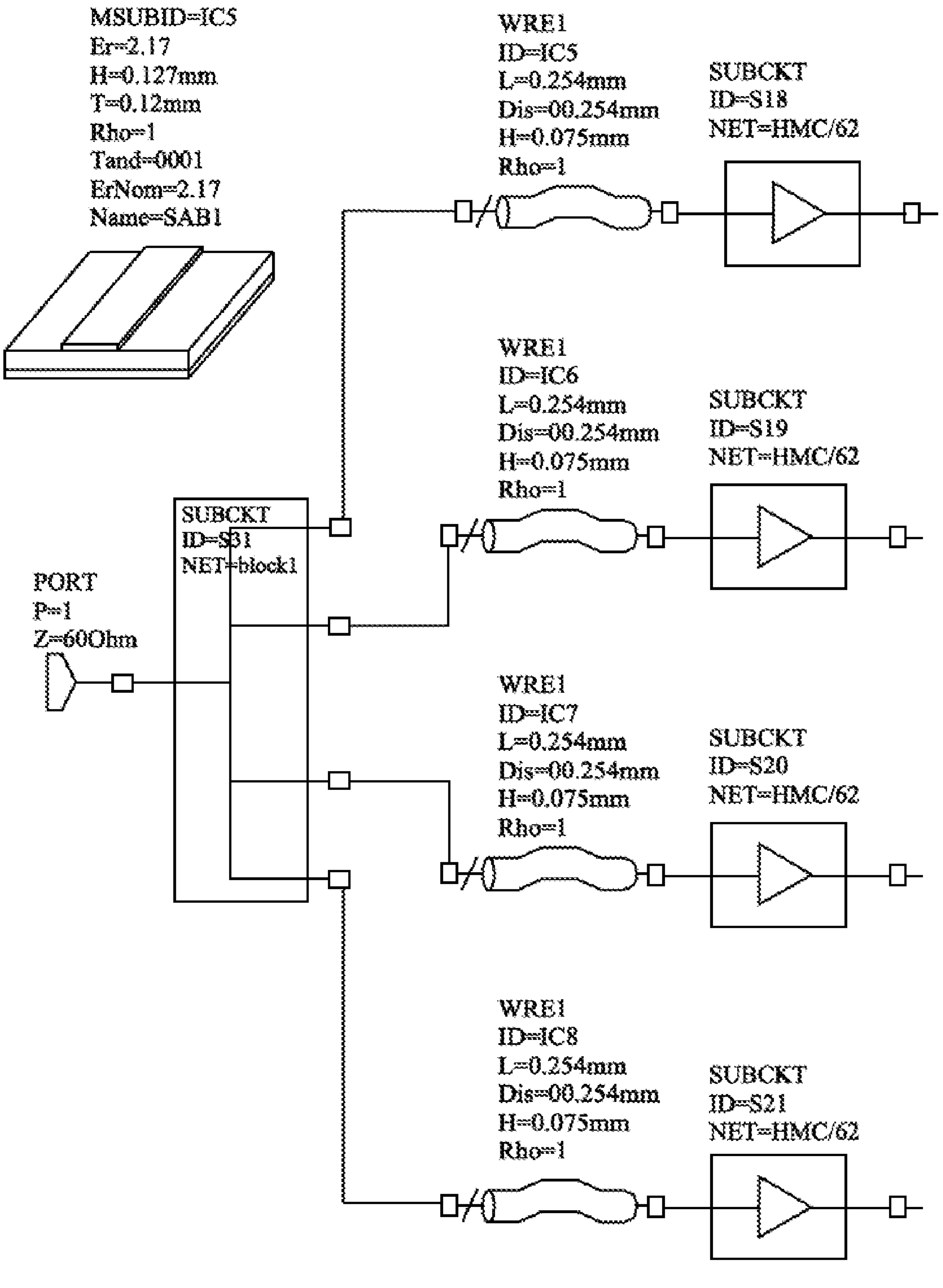
FIGS. 5A-5D are partial views which combine to show a full working system model of the switched multiplexer according to the invention.
Figure 5B:
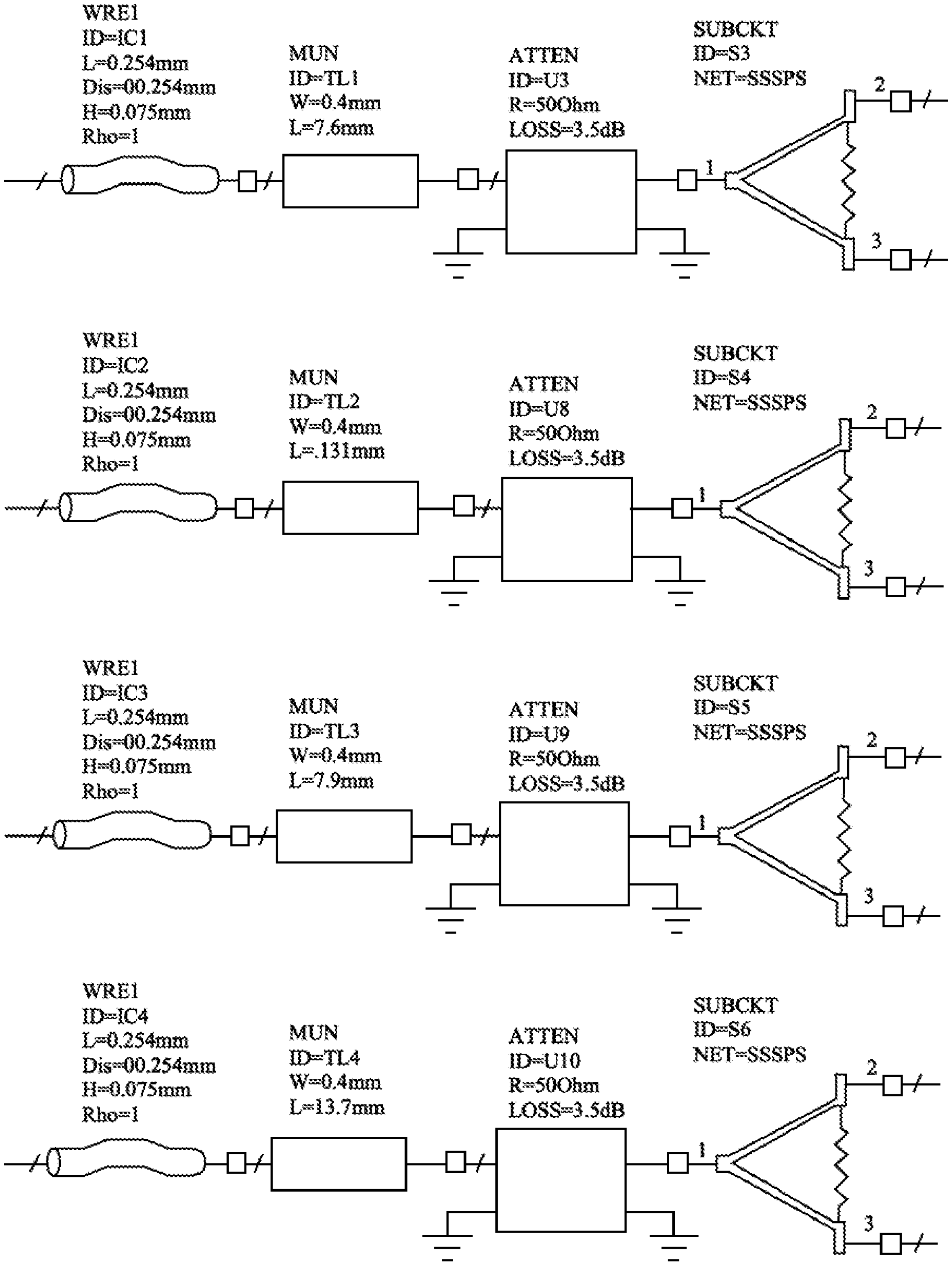
Figure 5C:
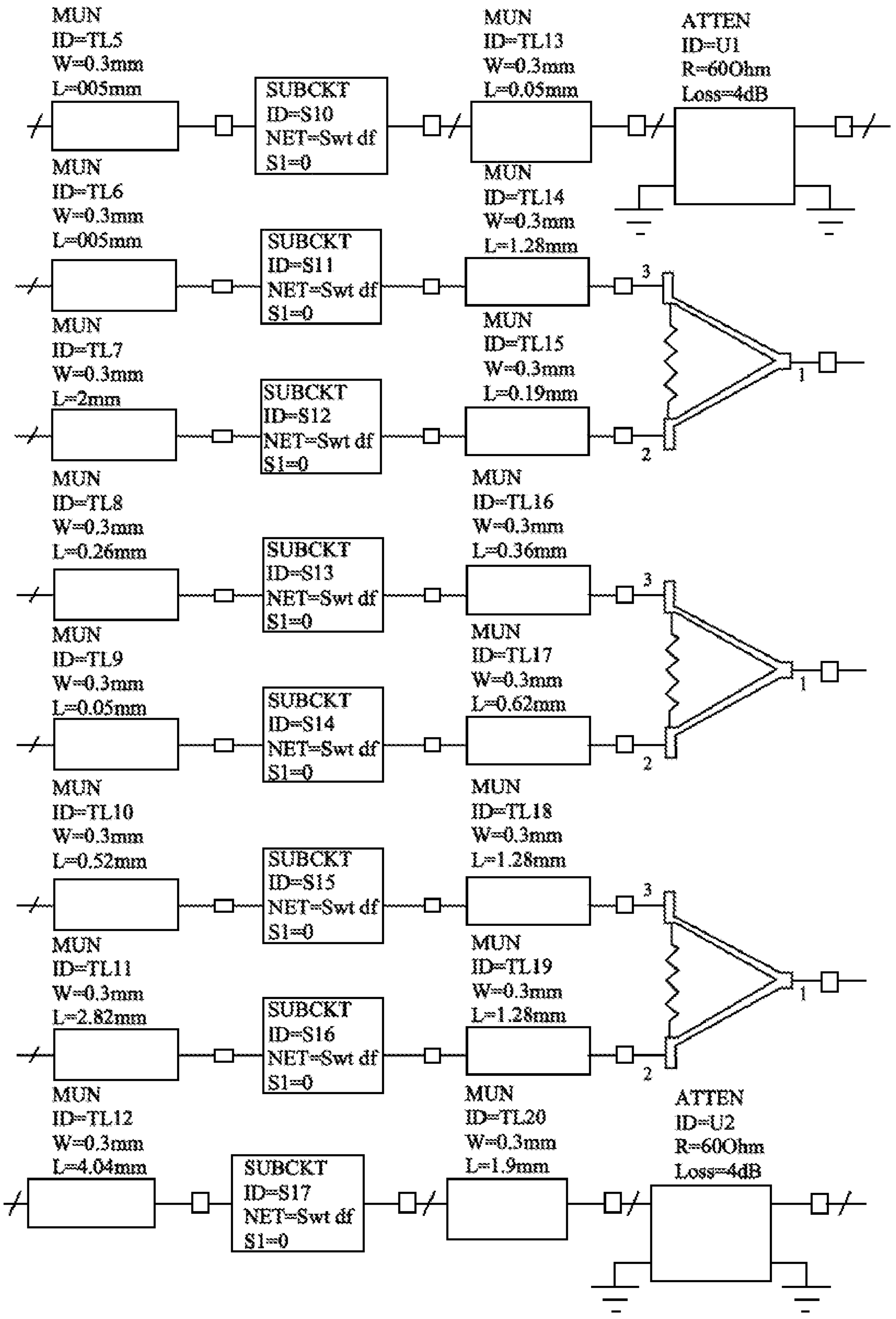
Figure 5D:
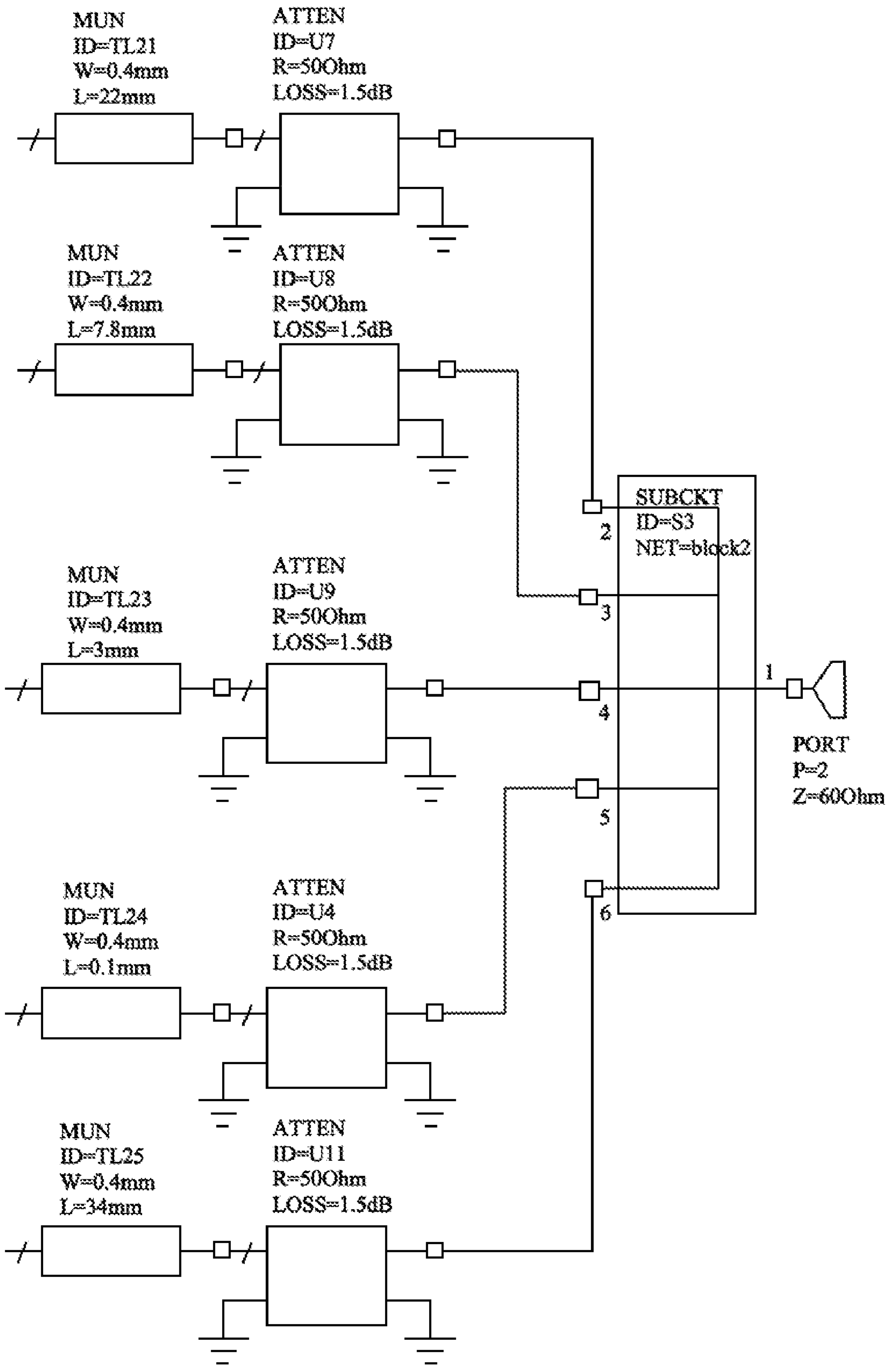

The design of the power divider 11 used in the invention is also realised in SSS technology as a tapered line structure with a resistive ink layer. To compact the size, a saw-tooth structure is used to increase the odd mode phase velocity, at the slight expense of isolation and match. Intuitively, we know λ=F(Vpe, Vpo), hence size reduction is feasible. The final design was modelled using an EM simulator. An initial prototype of this component was manufactured, as this element would eventually be embedded within the final layout. FIG. 4 illustrates the design. Across 2-18 GHz, both RL and Isolation measured 12 dB worst case, with a quarter wavelength equivalent to 4 GHz.

MMICs.

The MMIC switches 13 are Filtronic Compound Semiconductor, FMS2023, DC-20 GHz, FET non-reflective switches. The amplifiers used are Hittite HMC462, 2-18 Hz MMICs. Both mounted in a chip-in-duroid approach.

Full Working System Model.

Final Simulated Results

Figure 6:
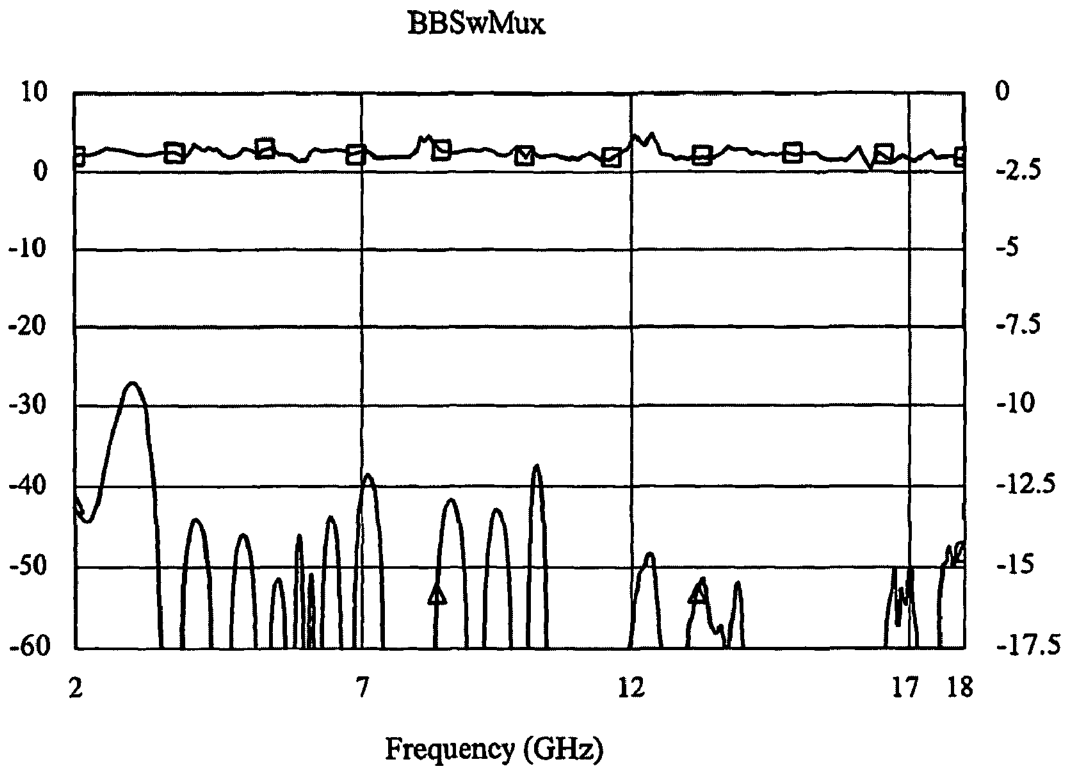
FIG. 6 shows simulated model performance.

The electrical model is updated to take into account the realisable mechanical design, including embedded EM analysis for all microwave transitions, and the final electrical lengths added. Finally, the multiplexers 2,3 are re-optimised for recombination. FIG. 6 shows the simulated performance of the final realisable model; the plot illustrates the predicted recombined response with all channels selected.

Mechanical Realisation

Figure 7:
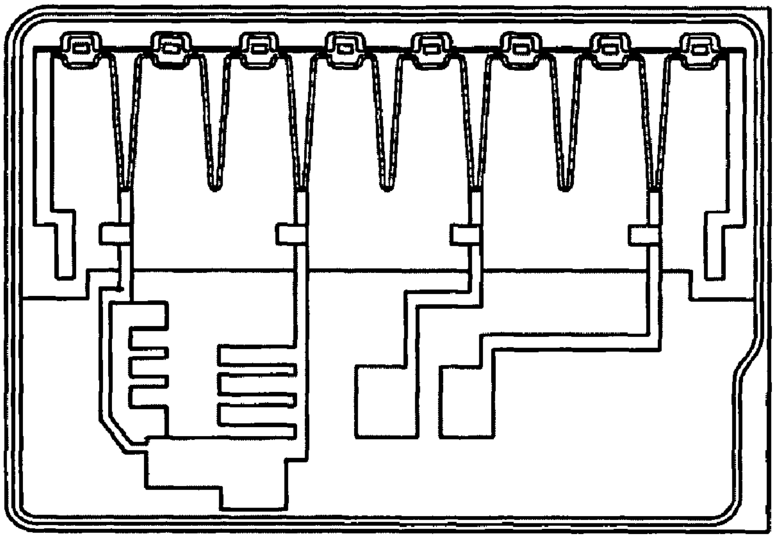
FIGS. 7 and 8 show a switched multiplexer according to the invention.
Figure 8:
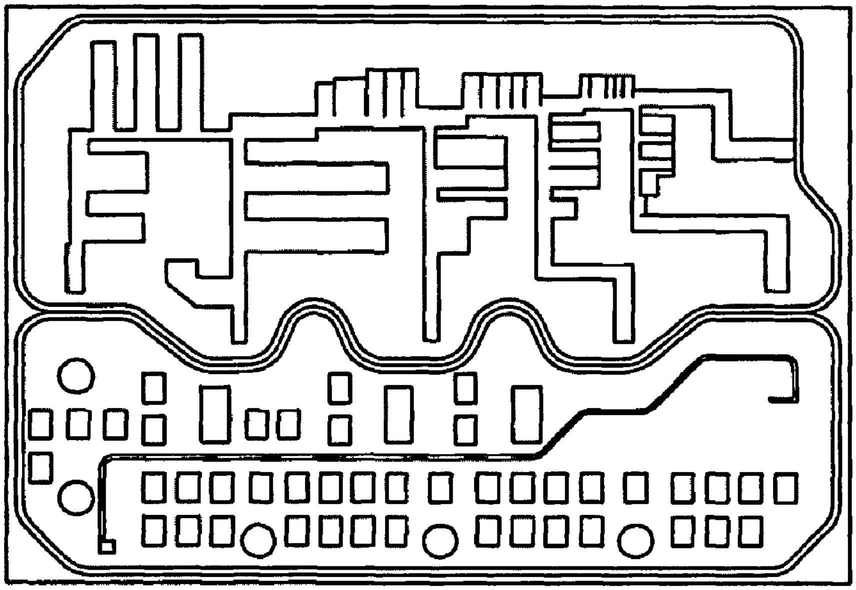
Figure 9:
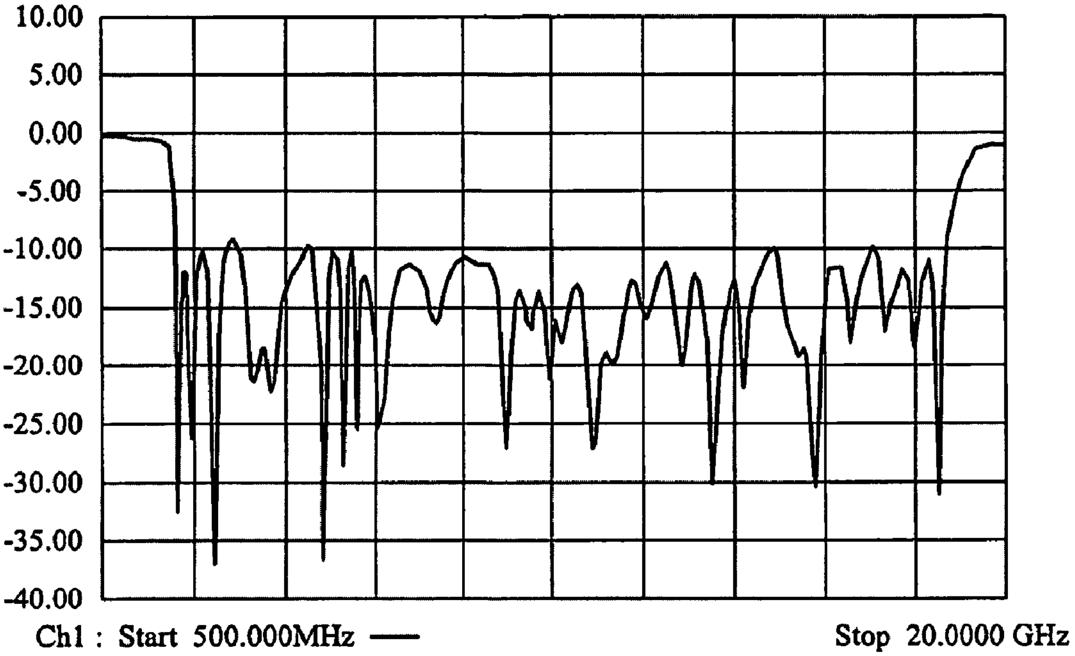
FIGS. 9 to 12 show the performance of the switched multiplexer of FIGS. 7 and 8.
Figure 10:
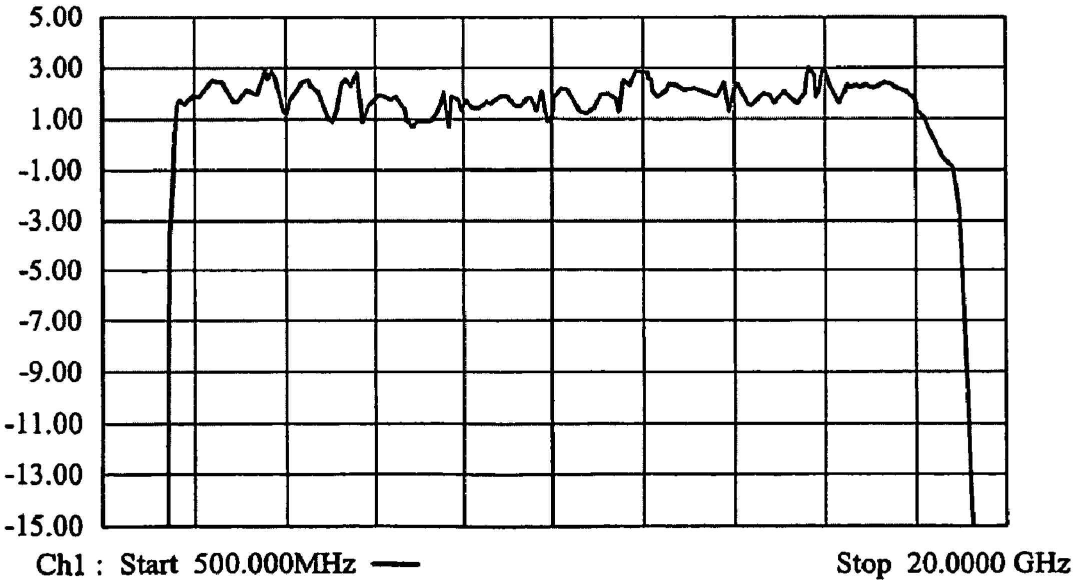
Figure 11:
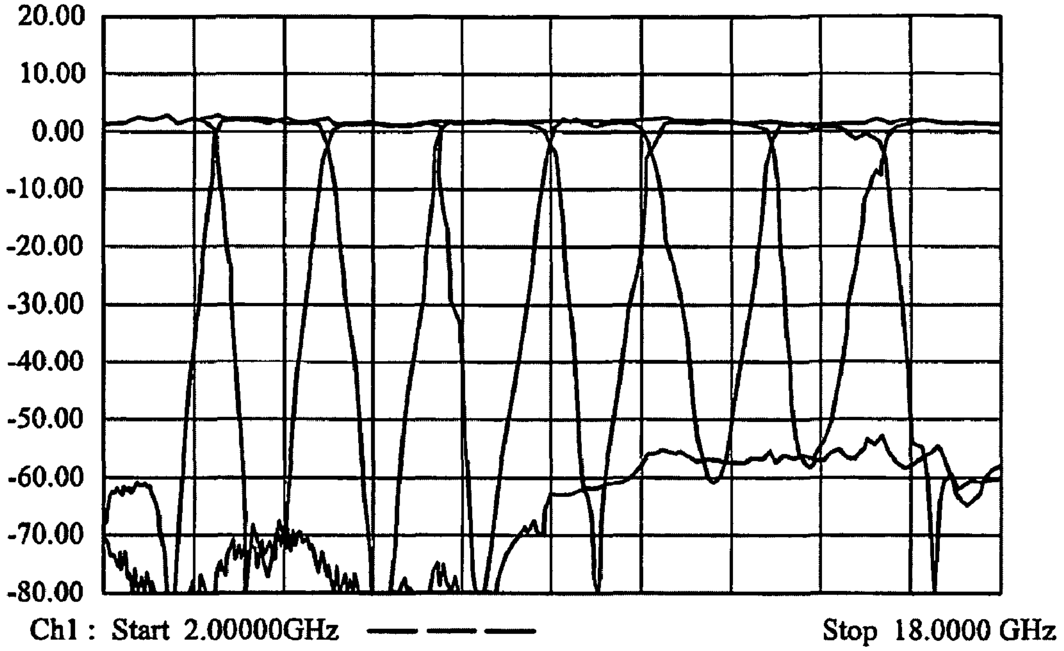
Figure 12:
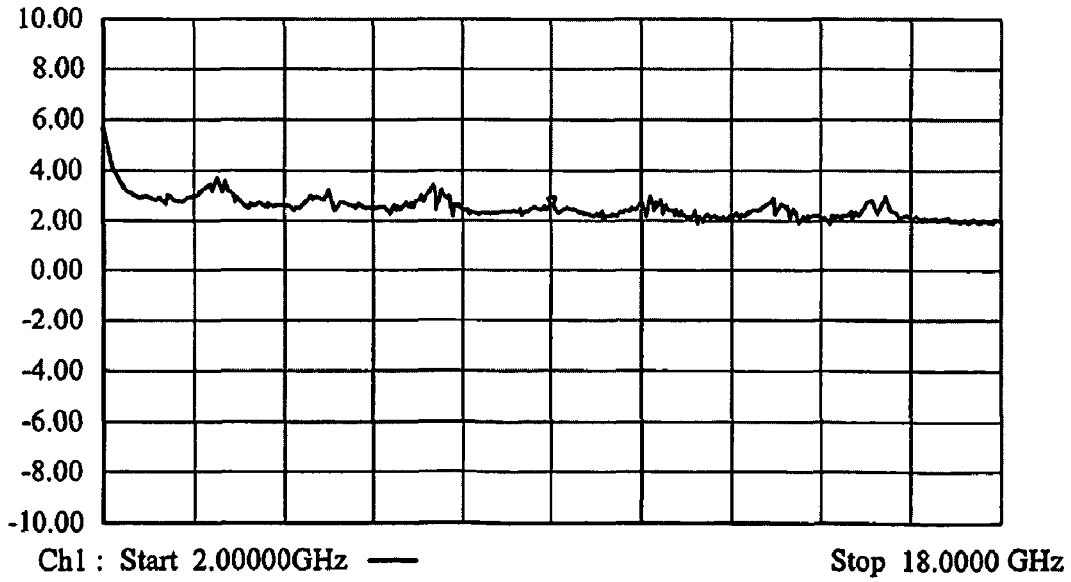

To make optimum use of space, a dual sided mechanical approach is adopted. The fold line in the electrical model is taken from the MMIC switches 13; the output dividers 11 are interleaved on the same microwave plane. Vertical RF transitions pass signals to the underside of the housing where the output multiplexer 3 is mounted directly beneath the input multiplexer 2. This allows the control and supply conditioning PCB to be located beneath the divider array and MMIC assembly for ease of control signal distribution without adversely affecting the microwave layout. FIGS. 7 and 8 show the two sides of the final assembly.

Measured Performance

FIG. 9 to FIG. 12, are plots taken using an Agilent PNA vector analyser.

In summary, the Small Signal Gain (SSG) achieved is nominally 2 dB with typical variation of +/−1 dB. Input VSWR measures 2:1 worst case with output match of 2.5:1 (not shown). Over 50 dB of rejection is achieved at adjacent band centres and beyond. The group-delay measures 4 ns maximum, with nominal variation of +/−1 ns across the full bandwidth (note: passband GD and in/out VSWR remain unaffected when bands are deselected).

Higher Levels of Integration and System Absorption

The design offers a broadband system a versatile front end preselector with excellent response characteristics of all key electrical parameters. However, most EW systems generally require not only wideband operation for HPI, but also channelise at an early stage, to improve dynamic range through noise, and spurious suppression for detailed processing. The invention inherently channelises throughout the architecture prior to recombining. If one replaces the input power dividers 11 with true 3-way tapered line structures utilising SSS technology, one can pass these channels out for narrowband processing with exceptionally low NF, for either switched, or parallel processing. In addition, one could add PIN limiters prior to the amplifiers for high-power protection (the input multiplexers are high 'Q' passive structures capable of handling relatively high power), this would result in high-power interference limiting only the band in which they appear, hence giving the effect of coarse frequency selective limiting.

The broadband switched multiplexer 1 according to the invention enables a single antenna feed to be used for multiple applications. In addition, the architecture can be enhanced, by extending the number of bands from 8 to 16, to increase preselection resolution. Adding a 0.5-2 GHz channel could also be considered valuable for some systems, with little increase in complexity.

In the embodiment of the invention shown above each input port passband overlaps with two output port passbands and vice versa. Other arrangements are possible, for example a single output port passband could overlap three or more input port passbands or vice versa.

In addition, spacings of input and output port passbands other than equally spaced are possible.

Other interdigitation schemes for input and output port passbands are possible. There could for example be a plurality of output port passbands between adjacent input port passbands or vice versa.

Figure 13:
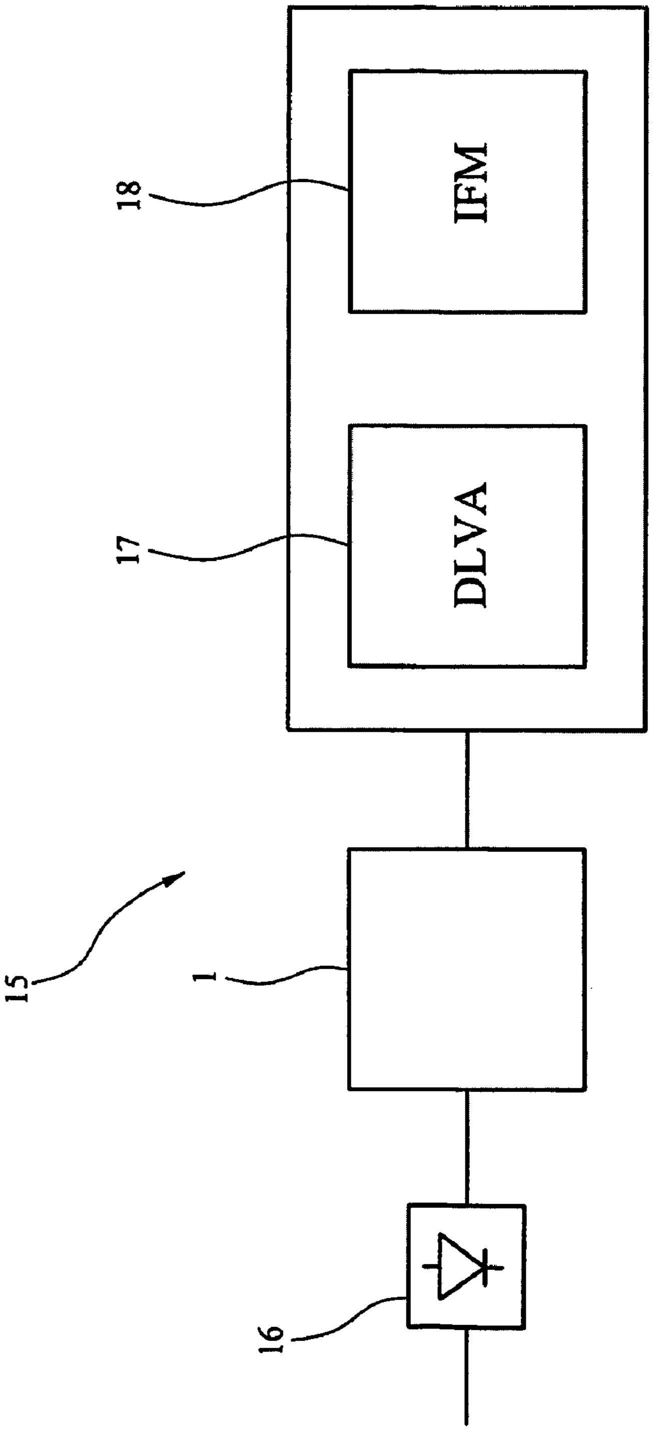
FIG. 13 shows a receiver including the broadband switched multiplexer according to the invention.

Shown in FIG. 13 is a receiver 15 incorporating a broadband switched multiplexer 1 according to the invention. A simple limiter 16 at the front end is required to protect the system from high power reception (typically from on-board transmitters). The broadband switched multiplexer 1 according to the invention allows channelisation, wide-open operation, or the ability to notch out any characterised signals. The DLVA/IFM 17,18 enables, amplitude, frequency and simple modulation scheme analysis This architecture in essence offers enhanced performance over the known schemes in the sense that it offers the ability to detect more than one simultaneous signal by means of notching out the highest power signal presented (on condition the secondary signal is not within the same band). This solution also removes the need to route video and RF signals across the installation platform, that is to say the output can be a full pulse descriptor digital word, routed as high-speed serial data such as USB, Firewire, or High Speed Ethernet.

However, limitations still exist, firstly, the system still remains blind when the limiter 16 fires. Secondly, multiple signals at similar power levels within the same band will result in erroneous results. More damaging, is the effect of system sensitivity. For known systems the front end noise factor (NF) prior to video measurement is defined by the NF of the system up to the DLVA 17, the system sensitivity is then improved by the channelisation, which limits broadband noise presented to the DLVA 17. Typical NF is in the order of 7 dB, with typical 10 dB in-band gain prior to the DLVA 17, with a noise BW of 4 GHz. For similar comparison with the receiver for FIG. 13, one must consider the NF up to the DLVA/IFM 17,18. FIG. 2 illustrates the NF performance of the broadband switched multiplexer 1 according to the invention. The increase in noise within the central band region in all-pass is due to contribution of broadband noise from adjacent channel amplifiers (NOTE: band 1 and band 8 has contribution from only one amplifier). When adjacent channels are switched off, the NF improves, however, the crossover region results in decreased signal level at the output, and hence degraded NF, however, this remains similar to current receivers.

When the system is operating in all-pass mode (16 GHz noise BW), the system sensitivity is significantly degraded in amplitude measurement and dynamic range of the IFM, i.e., one would have to switch off the majority of channels to achieve the same sensitivity as the current receivers, hence loosing all the advantages of the broadband switched multiplexer 1 according to the invention. In EW systems, sensitivity is possibly the most significant system parameter. This issue alone essentially makes the broadband switched multiplexer 1 according to the invention unsuitable as a front-end building block.

Figure 14:
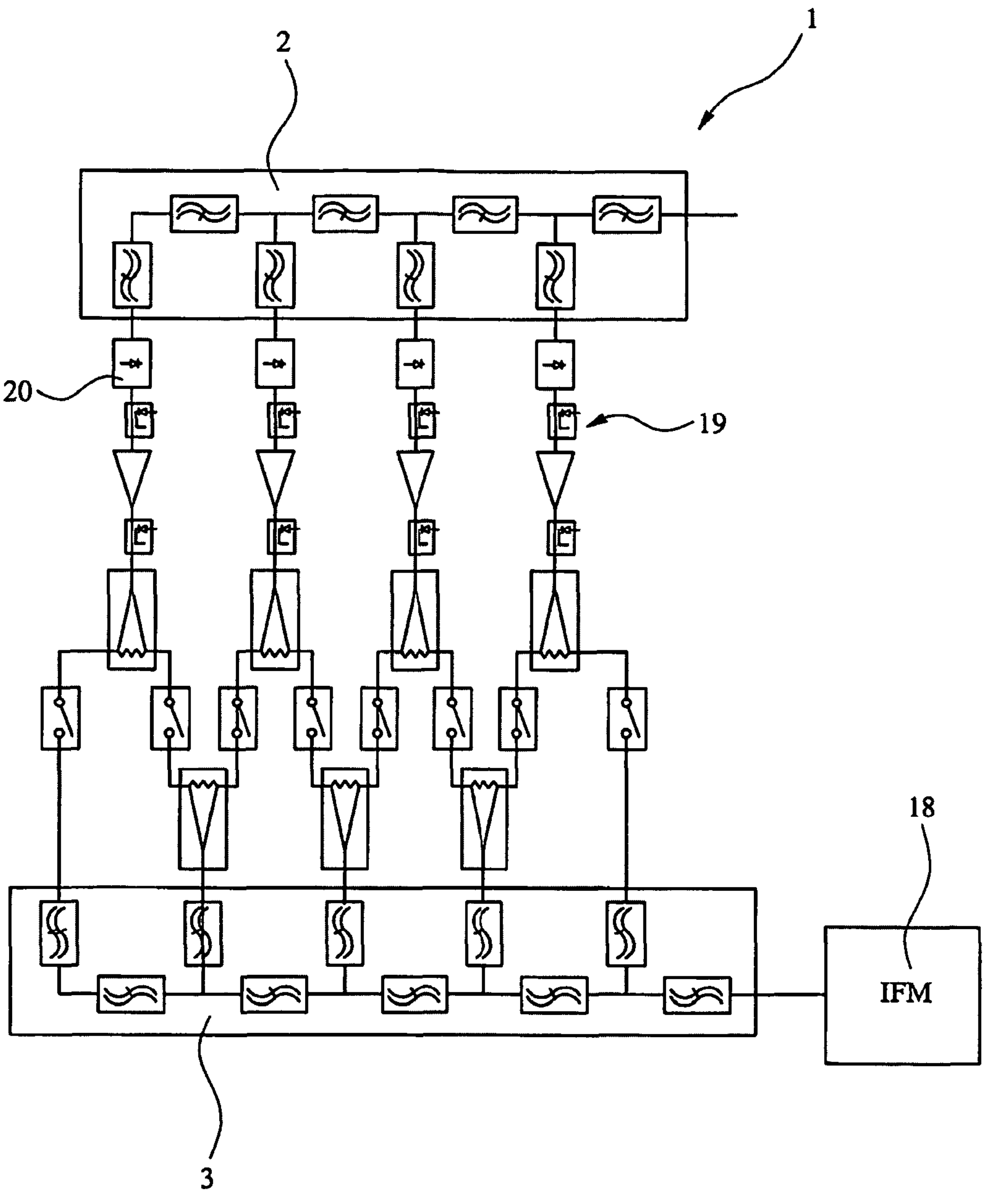
FIG. 14 shows a further embodiment of a switched broadband multiplexer according to the invention.

Shown in FIG. 14 is a further embodiment of a broadband switched multiplexer 1 according to the invention. In this embodiment amplitude measuring means 19 comprising DVLAs are included in the signal paths as shown. This improves sensitivity in comparison to the original system as the NF at this measurement point is exceptionally low, furthermore, as the input stage 2 is purely passive, capable of handling high power, one can move the limiter 16 from the front-end to limiter 20 within the signal paths as shown.

This architecture eliminates most of the limitations previously discussed. The NF up to the DLVA 19 is less than 3 dB, and the noise power generated by the DLVA 19 is also band limited. Utilising these DLVAs 19 as coarse tier discriminators enables one to switch off all other channels, resulting in lower noise power injected into the IFM 18 (improved SNR). Furthermore, any high power signal will only affect the band it falls within leaving the remainder of the frequency spectrum fully functional. It may be possible to use analogue switching to direct the low and high power detector diode outputs to a single video log amp for the accurate amplitude measurement, further reducing cost. If possible, these analogue switches can be used to chop the video prior to baseline restoration circuitry to measure CW amplitude; this will remove the need to introduce RF switches at the DLVA inputs, as used in the current system.

Figure 15:
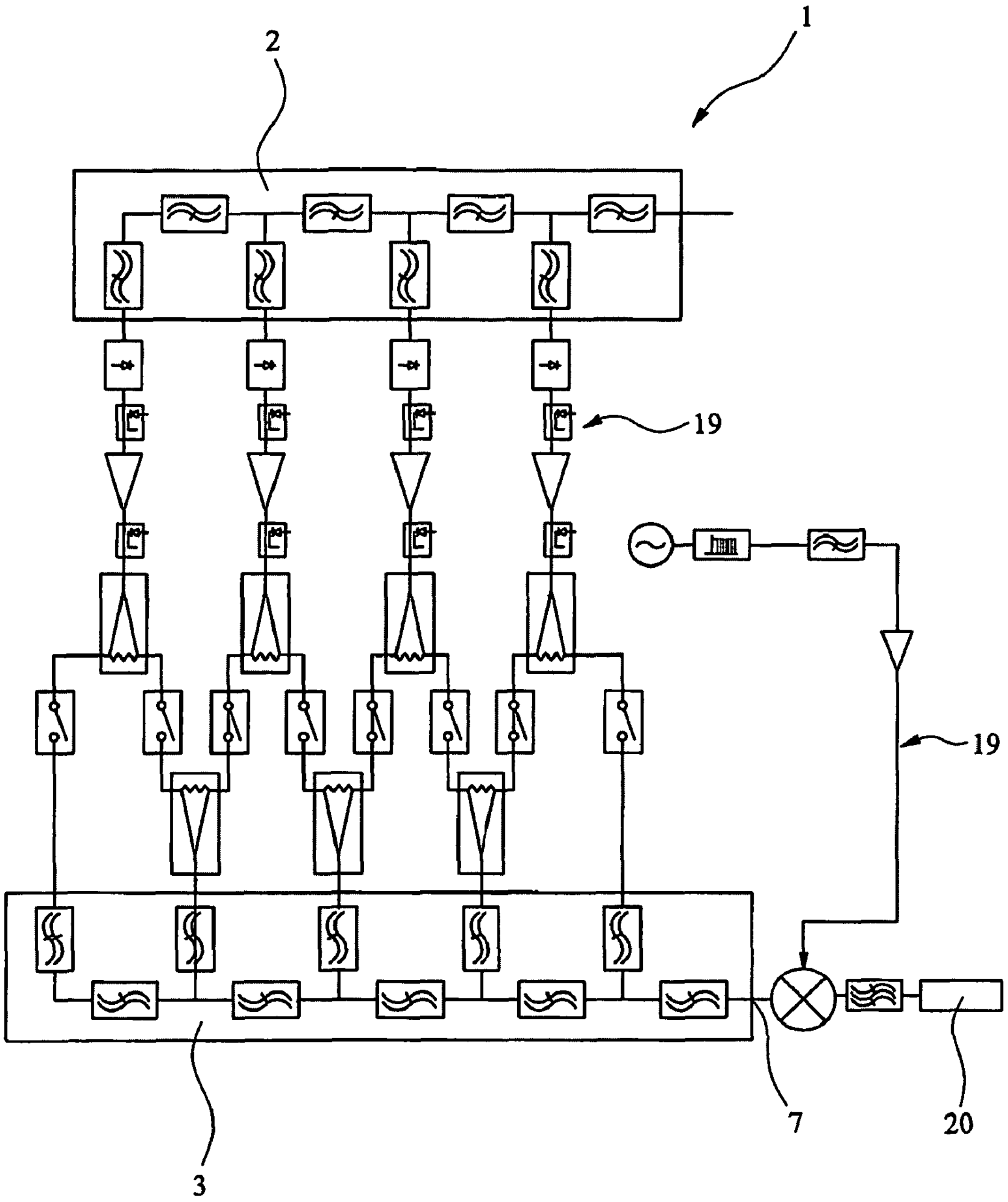
FIG. 15 shows a further embodiment of a switched broadband multiplexer according to the invention.

The embodiment of FIG. 14 utilises a single IFM 18 due to the cost of the unit. Shown in FIG. 15 is a further embodiment of a broadband switched multiplexer 1 according to the invention. This embodiment comprises a low band IFM (LBIFM) 20 connected to the output broadband port 7 of the output broadband multiplexer 3 via a frequency downconverter 21. The amplitude measurement means 19 of this embodiment act as threshold triggers opening or closing their associated signal paths 8 in response to the received signal. The frequency downconverter 21 reduces the signal from the output broadband port 7 by a factor depending upon which of the signal paths 8 arc open. In this way the signal provided to the LBIFM 20 is always in a frequency range acceptable to the LBIFM 20 even though the range of frequencies acceptable to the LBIFM 20 is narrower than that provided by the broadband output multiplexer 3.

Figure 16:
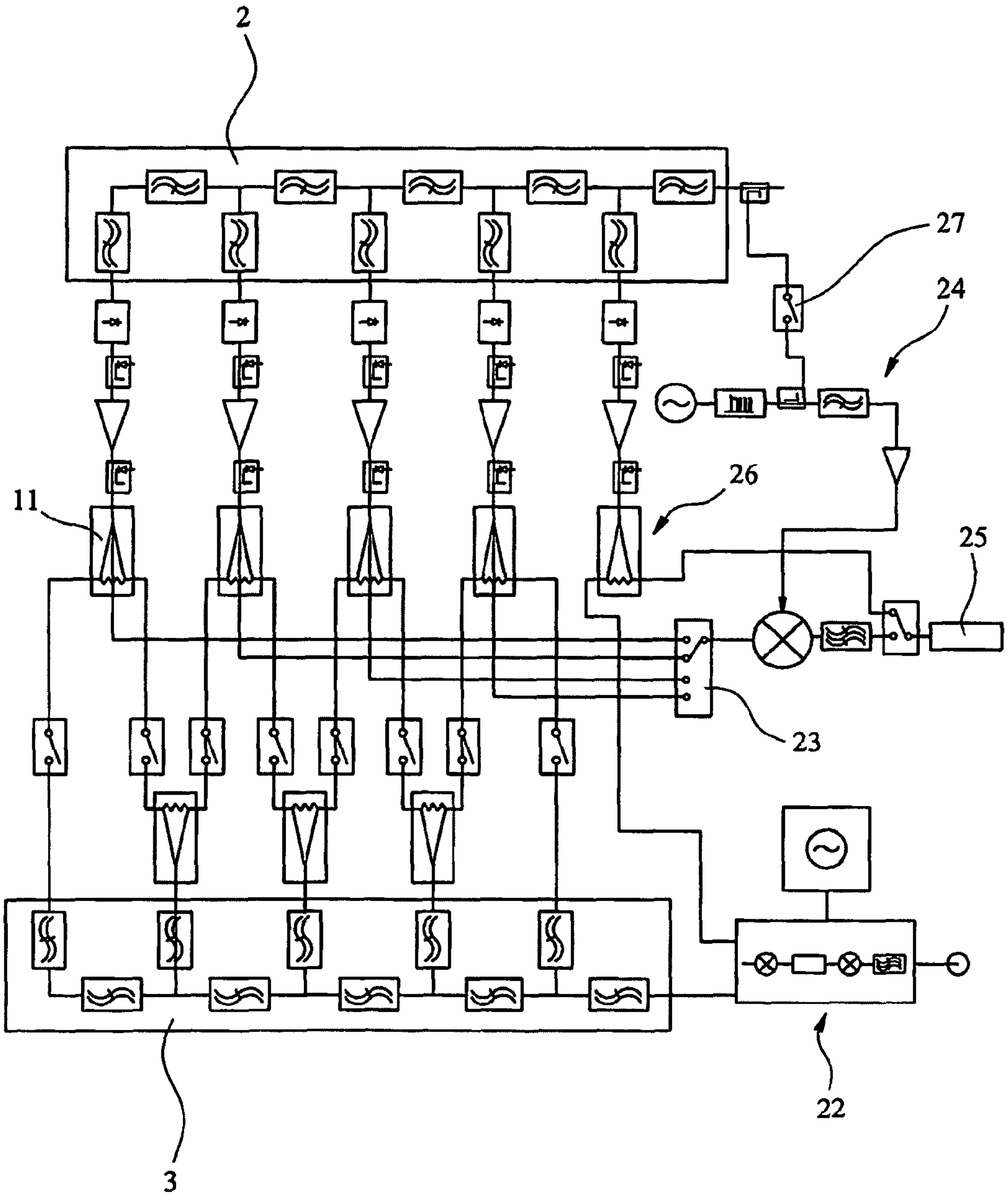
FIG. 16 shows a further embodiment of a switched broadband multiplexer according to the invention.

Shown in FIG. 16 is a further embodiment of this invention. In this embodiment a superheterodyne receiver 22 is connected to the broadband output port 7 of the output multiplexer 3. An output port of each of the plurality of power dividers 11 is connected to a switching means 23 having a plurality of input ports for the outputs from the power dividers and, an output purl. The output from the switching means 23 is connected to a frequency downconverter 24 which is in turn connected to a LBIFM 25. The switch 23 is adapted to switch between the outputs of different power dividers 11 depending upon the signal received. The downconverter 24 ensures the frequency received by the LBIFM 25 is within a suitable range as previously described.

Additional features added here include a 0.5 to 20 Hz front-end channelisation 26, which has its own activity detection and amplitude monitoring, but is routed directly to the LBIFM 25 and also routed independently to the output superheterodyne receiver 22 (as most superheterodyne receiver designs require the low band segment to undertake alternative mixing schemes for minimum spurious performance).

Also added is a weak coupler 27 to the main input which couples off power from the comb generator to use for end-to-end BIT functionality at low cost and complexity. If weak enough coupling is used, high power will offer no threat in terms of survival. This architecture offers completely independent Activity detection, WBRx, and NBRx operation, i.e., one can continuously report frequencies using the LBIFM from several different bands, whilst locking on and holding to any RF channel while simultaneously monitoring activity detection.

Figure 17:
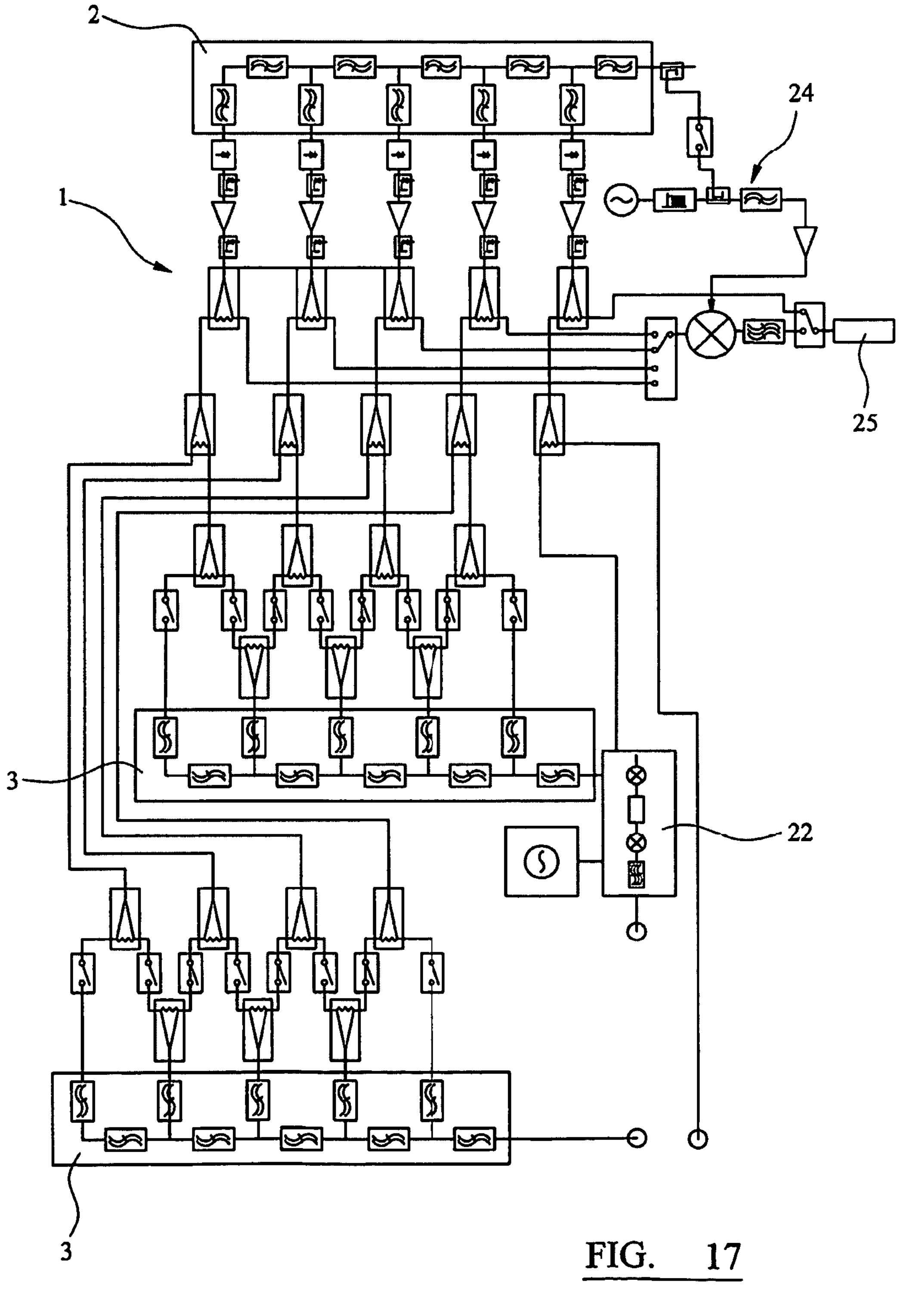
FIG. 17 shows a further embodiment of a switched broadband multiplexer according to the invention.

Shown in FIG. 17 is a further example of a broadband switched multiplexer 1 according to the invention. This embodiment comprises a further output broadband multiplexer 3 which may be used to add additional functionality.

The invention claimed is:

1. A broadband switched multiplexer comprising:

an input broadband demultiplexer comprising a broadband input port for receiving an input broadband signal and a plurality of output ports, each having a different passband;

an output broadband multiplexer comprising a plurality of input ports and a broadband output port, each input port having a different passband, each input port passband overlapping a different portion of the demultiplexer output port passband;

the passbands being arranged such that each of the input port passbands at least partially overlaps an output port passband, at least some of the input port passbands overlapping two output port passbands;

the demultiplexer output ports being in communication with the multiplexer input ports by signal paths, each signal path having a switch for opening and closing the path therein; and wherein the demultiplexer has n output ports, the input and output port passbands being arranged such that there are one of 2n and 2(n−2)+2 through channels of overlapping input and output port passbands.

2. A broadband switched multiplexer as claimed in claim 1, wherein the centres of the input port passbands and the output port passbands are interdigitated, at least some of the input port passbands being sufficiently broad as to overlap the output port passbands on either side.

3. A broadband switched multiplexer as claimed in claim 1, wherein at least some of the output port passbands are sufficiently broad as to overlap the input port passbands on either side.

4. A broadband switched multiplexer as claimed in claim 1, wherein the input and output port passbands overlap so as to form a chain of alternating overlapping input and output port passbands.

5. A broadband switched multiplexer as claimed in claim 1, wherein the centres of at least one of the input port passbands and output port passbands are equally spaced.

6. A broadband switched multiplexer as claimed in claim 1, wherein the switches in the signal paths are non reflective.

7. A broadband switched multiplexer as claimed in claim 1, wherein at least one signal path comprises a signal limiter.

8. A broadband switched multiplexer as claimed in claim 1, wherein at least one of the multiplexer or demultiplexer is a broadband lowband/highband cascade multiplexer/demultiplexer.

9. A broadband switched multiplexer as claimed in claim 8, comprising at least one power combiner for combining signals from at least two output ports and providing the combined signal to an input port, the passband of the input port overlapping the passbands of the output ports.

10. A broadband switched multiplexer as claimed in claim 9, wherein at least one power combiner is adapted to combine split signals from two different power dividers and provide the combined signal to an input port.

11. A broadband switched multiplexer as claimed in claim 1 wherein at least one signal line includes an attenuator.

12. A broadband switched multiplexer as claimed in claim 1, further comprising at least one power divider positioned within a signal path for splitting a received signal from the corresponding output port into at least two portions, at least one of the portions being received by an input port having a passband which overlaps that of the output port.

13. A broadband switched multiplexer as claimed in claim 12, comprising a plurality of power dividers, each power divider being adapted to split a signals from an associated output port into at least two portions, at least one portion of each signal being received by at least one input port.

14. A broadband switched multiplexer as claimed in claim 13, further comprising frequency measurement means, the frequency measurement means being adapted to receive signal portions from a plurality of power dividers.

15. A broadband switched multiplexer as claimed in claim 14, further comprising switching means between the power dividers and the frequency measurement means, the switching means being adapted to connect the frequency measurement means to different power dividers.

16. A broadband switched multiplexer as claimed in claim 13, comprising at least one further output broadband multiplexer, the output broadband multiplexer having a plurality of input ports and a broadband output port, at least some of the power dividers having an output connected to an input port of the further output broadband multiplexer.

17. A broadband switched multiplexer as claimed in claim 16, wherein the output broadband port of one output broadband multiplexer is connected to a frequency measurement means and the output broadband port of the additional broadband multiplexer is connected to a superheterodyne receiver.

18. A broadband switched multiplexer as claimed in claim 12, wherein at least one power divider splits the signal from an output port into two portions, the two portions being received by two input ports, the input ports having passbands which overlap that of the output port connected to the power divider.

19. A broadband switched multiplexer as claimed in claim 1, wherein a plurality of signal paths from associated output ports comprise amplitude measurement means, preferably detector log video amplifiers (DLVAs).

20. A broadband switched multiplexer as claimed in claim 19, wherein the amplitude measurement means are narrowband amplitude measurement means relative to the broadband demultiplexer.

21. A broadband switched multiplexer as claimed in claim 19, wherein each amplitude measurement means is adapted to open or close its associated signal path between output and input ports depending upon the signal measured by the amplitude measurement means.

22. A broadband switched multiplexer as claimed in claim 21, further comprising frequency measurement means connected to the output broadband port of the output broadband multiplexer.

23. A broadband switched multiplexer as claimed in claim 22, wherein the frequency measurement means is a narrowband frequency measurement means relative to the broadband multiplexer.

24. A broadband switched multiplexer as claimed in claim 22, further comprising a frequency down converter between broadband multiplexer and frequency measurement means, the frequency down converter adapted to shift the frequency of the signal received from the broadband output port of the multiplexer by a factor dependent upon which signal path between input demultiplexer and output multiplexer is open.

25. A broadband switched multiplexer as claimed in claim 1, comprising a superheterodyne receiver connected to the output broadband port of the output broadband multiplexer.

* * * * *